United States Patent
Oh

(10) Patent No.: US 8,878,592 B2
(45) Date of Patent: Nov. 4, 2014

(54) SIMULTANEOUS SWITCHING NOISE CANCELLATION BY ADJUSTING REFERENCE VOLTAGE AND SAMPLING CLOCK PHASE

(71) Applicant: Rambus Inc., Sunnyvale, CA (US)

(72) Inventor: Kyung Suk Oh, Cupertino, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/871,193

(22) Filed: Apr. 26, 2013

(65) Prior Publication Data

US 2013/0307607 A1 Nov. 21, 2013

Related U.S. Application Data

(60) Provisional application No. 61/639,603, filed on Apr. 27, 2012.

(51) Int. Cl.
- *H03K 17/16* (2006.01)
- *G11C 29/02* (2006.01)
- *H03K 3/013* (2006.01)
- *G11C 7/10* (2006.01)
- *H03K 19/003* (2006.01)

(52) U.S. Cl.
CPC .............. *H03K 3/013* (2013.01); *G11C 29/021* (2013.01); *G11C 2207/2254* (2013.01); *G11C 29/022* (2013.01); *G11C 29/023* (2013.01); *G11C 7/1093* (2013.01); *G11C 7/1084* (2013.01); *G11C 29/028* (2013.01); *H03K 19/00346* (2013.01)
USPC .............................. 327/384; 375/355; 375/347

(58) Field of Classification Search
USPC ................................. 327/91, 94–96; 375/355
See application file for complete search history.

(56) References Cited

U.S. PATENT DOCUMENTS

| | | | |
|---|---|---|---|
| 6,188,737 B1 * | 2/2001 | Bruce et al. | 375/355 |
| 6,519,302 B1 * | 2/2003 | Bruce et al. | 375/355 |
| 6,999,516 B1 | 2/2006 | Rajan | |
| 7,039,328 B2 * | 5/2006 | Oomori et al. | 398/202 |
| 7,184,483 B2 | 2/2007 | Rajan | |
| 7,560,936 B1 * | 7/2009 | Hronik | 324/537 |
| 8,453,019 B2 * | 5/2013 | Newcomb et al. | 714/704 |

(Continued)

OTHER PUBLICATIONS

Agrawal, Ankur, "Design of High Speed I/O Interfaces for High Performance Microprocessors," Dissertation in partial fulfillment of the requirements for a Doctor of Philosophy in the subject of Engineering Sciences at Harvard University, Oct. 2010. 139 pages.

*Primary Examiner* — Ryan Jager
(74) *Attorney, Agent, or Firm* — Fenwick & West LLP

(57) ABSTRACT

A data signal is transmitted from a first circuit to a second circuit, with noise and/or jitter added to the data signal by supply noise in the power distribution network in the first circuit and/or a second circuit being effectively canceled out by adjustment of the reference voltage and/or the phase of the sampling clock used for sampling of the data signal in a manner that effectively mimics such noise and/or jitter added to the data signal. The second circuit uses a filter that has the impedance profile and/or the jitter profile of such power distribution network. The bus weight and/or the number of switching bits in the data pattern transmitted from the first circuit to the second circuit is applied to the filter to determine the adjustment to be made to the reference voltage or the phase of the sampling clock.

24 Claims, 12 Drawing Sheets

(56) References Cited

U.S. PATENT DOCUMENTS

| | | | |
|---|---|---|---|
| 2009/0110116 A1* | 4/2009 | Hollis | 375/317 |
| 2009/0268520 A1* | 10/2009 | Roohparvar | 365/185.09 |
| 2010/0017158 A1* | 1/2010 | Mandrekar et al. | 702/69 |
| 2010/0202202 A1* | 8/2010 | Roohparvar | 365/185.08 |
| 2011/0127990 A1* | 6/2011 | Wilson et al. | 324/76.44 |
| 2011/0274215 A1* | 11/2011 | Hollis | 375/317 |
| 2012/0182044 A1 | 7/2012 | Oh | |
| 2012/0314721 A1* | 12/2012 | Bulzacchelli et al. | 370/503 |

\* cited by examiner

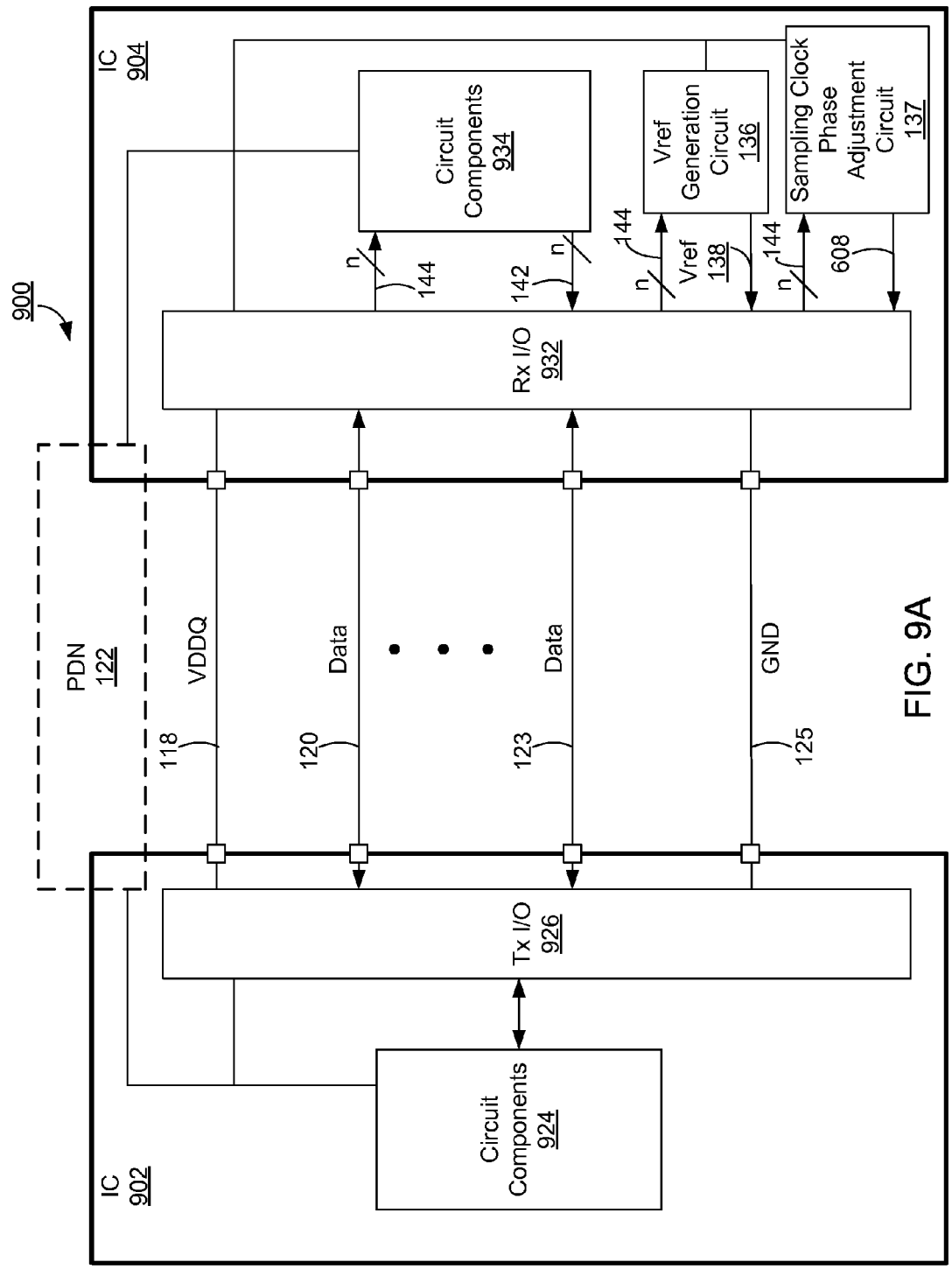

SIMULTANEOUS SWITCHING NOISE CANCELLATION BY ADJUSTING REFERENCE VOLTAGE AND SAMPLING CLOCK PHASE

BACKGROUND

The present disclosure generally relates to reducing performance degradation due to simultaneous switching noise.

Integrated circuit devices communicate with one another using input/output (I/O) circuits that are configured to transmit and receive multi-bit data over a plurality of signal lines forming a bus. When multiple output drivers on the circuits change state at the same time at a high speed to transmit the multi-bit data, the changing current drawn by the output drivers from a power supply induces a voltage that results in power supply disturbance, commonly referred to as simultaneous switching output ("SSO") noise (or simultaneous switching noise ("SSN")).

SSN can cause undesired behavior in the receiver side of the integrated circuits, especially in a system that communicates the data using single ended signaling. Modern receivers using single ended signaling compare the data signal received over the signal lines with a reference voltage to determine the logic level ("1" or "0"). If SSN is induced in the data signal transmitted to the receiver, the data signal may be at a voltage level different from the prescribed voltage level for single ended signal that would ensure a sufficient margin between the voltage level and the reference voltage used for comparison with the data signal, and thus result in signaling error.

BRIEF DESCRIPTION OF THE DRAWINGS

The teachings of the embodiments herein can be readily understood by considering the following detailed description in conjunction with the accompanying drawings.

FIGS. 9A and 9B illustrate systems that adjust the reference voltage and/or the sampling clock phase used for sampling data transmitted between integrated circuits, according to still other embodiments.

DETAILED DESCRIPTION OF EMBODIMENTS

Embodiments include a system where a data signal is transmitted from a first circuit to a second circuit with noise and/or jitter added to the data signal by supply noise in the power distribution network in the first circuit and/or a second circuit being effectively canceled out by adjustment of the reference voltage and/or the phase of the sampling clock used for sampling of the data signal in a manner that effectively mimics such noise and/or jitter added to the data signal. In one embodiment, the second circuit uses a filter that has the impedance profile and/or the jitter profile of such power distribution network. In one embodiment, the bus weight and/or the number of switching bits in the data pattern transmitted from the first circuit to the second circuit is applied to the filter to determine the adjustment to be made to the reference voltage or the phase of the sampling clock. By using a reference voltage or phase of the sampling clock that is adjusted to reflect the noise and/or jitter added to the data signal caused by the supply noise in such power distribution network, such noise and/or jitter are effectively canceled out as if they did not exist in the data signal.

Reference will now be made to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

Figure 1:
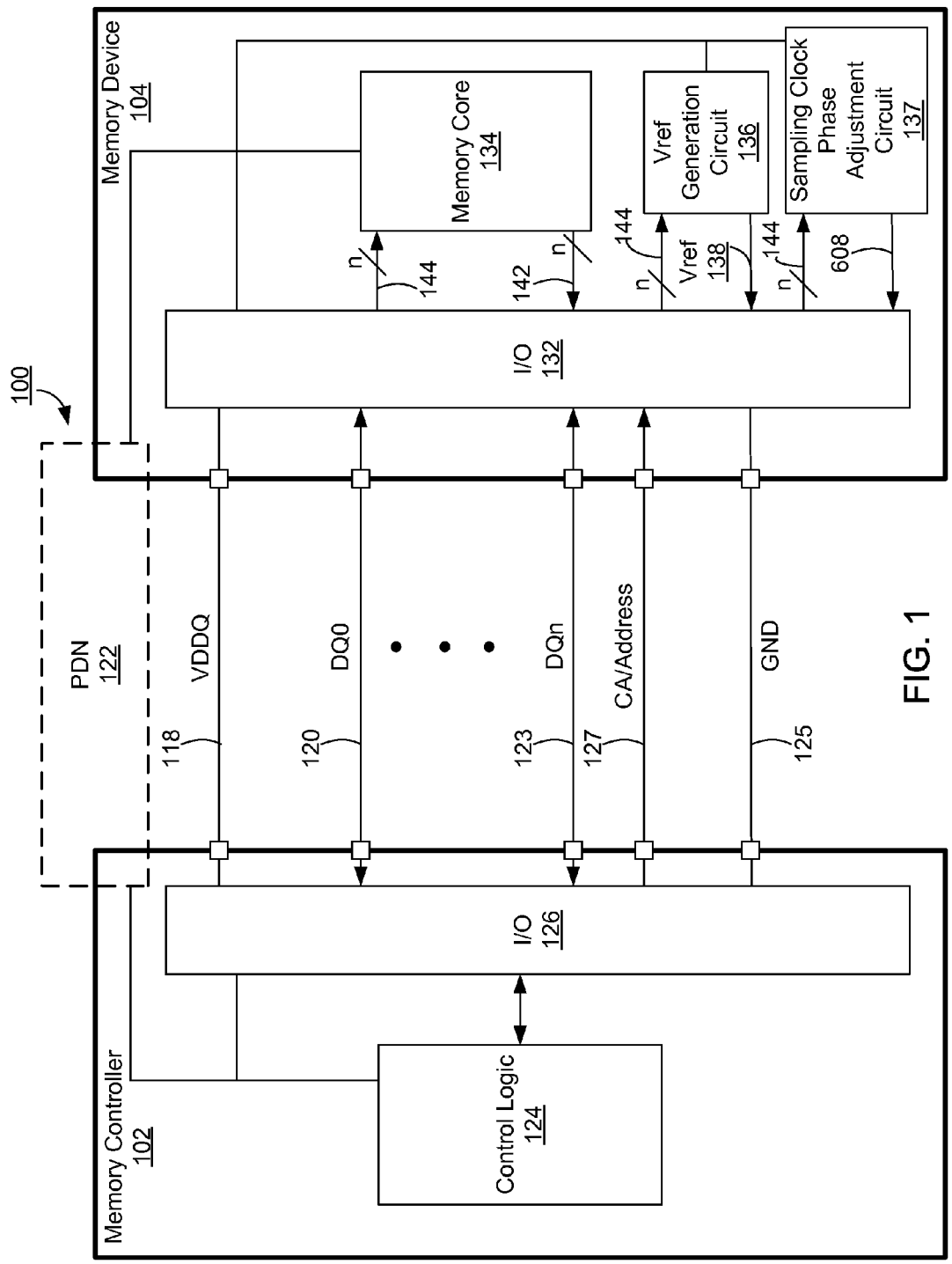
FIG. 1 illustrates a memory system that adjusts the reference voltage and/or the sampling clock phase used for sampling data in the receiver of a memory device, according to one embodiment.

FIG. 1 illustrates a memory system that adjusts the reference voltage and/or the sampling clock phase used for sampling data in the receiver of a memory device, according to one embodiment. In one embodiment, the memory system includes a memory controller integrated circuit ("IC") ("memory controller" or "controller" hereafter) coupled to one or more memory device ICs ("memory components" or "memory devices" hereafter) through a signaling interface. For example, FIG. 1 presents a block diagram illustrating an embodiment of memory system 100, which includes a memory controller 102 coupled to a memory device 104 via signaling interfaces 118, 120, 123, 125, 127, and a power distribution network (PDN) that powers both the memory controller 102 and memory device 104. Memory device 104 may be a DRAM (dynamic random access memory), SRAM (standard random access memory), a non-volatile memory such as a flash memory, or any other type of memory device.

Memory controller 102 includes control logic 124, and I/O interface 126 that includes transmitters (not shown) and receivers (not shown). Memory device 104 includes memory core 134, Vref generation circuit 136, sampling clock phase adjustment circuit 137, and I/O interface 132 that also includes transmitters (not shown) and receivers (not shown). Other components present in memory controller 102 and memory device 104 not directly necessary for illustrating the embodiments herein are omitted for simplicity of illustration. Also, while the embodiments herein will be explained in the context of memory controller 102 transmitting data signals to memory device 104 via transmitters in I/O 126 and receivers in I/O 132 for WRITE operations, the embodiments herein may equally be used for transmission of data signals from memory device 104 to memory controller 102 via transmitters (not shown) in I/O 132 and receivers (not shown) in I/O 126 for READ operations. Furthermore, while the embodiments herein will be explained in the context of transmission of data signals between memory controller 102 and memory device 104, the embodiments herein may equally be used for transmission of command/address signals 127.

The memory controller 102 and memory device 104 communicate via a data bus including a plurality of data signal lines 120, 123 for carrying data DQ0 through DQn using single-ended signaling in this example, a supply voltage line 118 coupled to the supply voltage VDDQ, and ground line 125 coupled to ground voltage GND, and other links such as command/address link 127 and others that are not shown herein for simplicity of illustration. While FIG. 1 illustrates memory system 100 having one memory controller 102 and one memory device 104, other embodiments may have additional memory controllers and/or more memory devices 104. In one embodiment, memory controller 102 and memory devices 104 may be implemented as separate dies within the same package. In other embodiments, they are implemented in their own respective packages.

Control logic 124 generates various command/address signals (CA/Address) to transmit to memory device 104 over CA/address line 127 to control the operation of memory device 104 and read or write data from/to memory device 104. I/O 126 includes transmitters (not shown) and receivers (not shown) for transmitting and receiving data and command/address signals to/from the memory device 104. PDN 122 provides power to the various components of memory controller 102, including control logic 124 and I/O 126. When multiple data signals among DQ0 and DQn switch, they can generate supply noise as PDN 122 has finite impedance. The amplitude of the supply noise depends on the switching activity of DQ signals and the impedance profile of PDN 122. This supply noise in turn couples into the individual data signals. The signal noise in the data signals causes the data signals transmitted over the bus 120-123 to be at a voltage level different from the prescribed voltage level for signal ended signaling that would ensure a sufficient margin between the voltage level and a reference voltage, thereby causing error when the data signal is sampled and recovered in memory device 104. Since PDN 122 includes inductive and capacitive components, the supply noise may peak near the resonant frequency defined by the inductive and capacitive components of PDN 122, which may be around 50-300 MHz in modern memory devices. Such frequency of the PDN supply noise is relatively much lower than the signaling rate of the data signals DQ0 through DQn.

Memory core 134 includes a number of memory cells that store write data 144 received from memory controller 102 and output read data 142 to transmit to memory controller 102 in response to command/address signals received from memory controller 102. I/O 132 includes transmitters (not shown herein) and receivers (not shown in FIG. 1) for transmitting and receiving data and command/address signals to/from the memory controller 102. As will be explained in more detail below, the receivers in I/O 132 include comparators for comparing the received data and command/address signals with a reference voltage (Vref) 136 to determine the logic level of the received data and command/address signal (logic high ("1") or logic low ("0")) and samplers (not shown in FIG. 1) for sampling the determined logic levels of the received data and command/address signal in synchronization with a sampling clock signal at certain predetermined timings (or phases).

Vref generation circuit 136 generates the reference voltage (Vref) 138 to use in the receivers of I/O 132. In generating Vref 138, Vref generation circuit 136 determines the bus weight (i.e., the number of ones or logic high bits) and/or the number of switching bits in the data signals DQ0-DQn received over the data bus 120-123, and uses that information to determine the amount of offset to add or subtract to/from a nominal reference voltage. As will be explained in more detail, the offset is designed to mimic the noise coupled from the SSN at the memory controller 102 and/or memory device 104. Such offset may vary dynamically, for example, with each sampling period or other predetermined period depending upon bus weight and/or the number of switching bits. The receivers in I/O 132 uses the Vref 138 including such offset to determine the logic levels of data signals. Since Vref 138 includes such offset mimicking the noise induced into the data signals due to SSN, the receivers in I/O 132 may more accurately determine the logic level of the received additional data signals. While the offset is updated using logic levels of data signals received at earlier times, the adjusted Vref 138 still enhances the accuracy of the receivers since the frequency of the supply noise is relative lower (e.g., medium frequency dominant at around 50 MHz to 250 MHz) than the signaling rate of the data signal. Since the supply noise is relative low frequency and the offset is determined based on total bus activity, the adjusted Vref can be used with all signal lines (pins) of the bus in the receiver.

Sampling clock phase adjustment circuit 137 generates clock signal 608 to be used for sampling the received data signals DQ0 through DQn in the receivers of I/O 132. In adjusting the sampling clock phase, sampling clock phase adjustment circuit 137 determines the bus weight (i.e., the number of ones or logic high bits) and/or the number of switching bits in the data signals DQ0-DQn received over the data bus 120-123, and uses that information to determine the amount of adjustment to be made to the phase of the sampling clock. As will be explained in more detail, the phase adjustment is designed to mimic the jitter contributed to the data signals DQ0-DQn by SSN in memory controller 102 and/or memory device 104. The receivers in I/O 132 use the sampling clock with the phase adjusted to sample the logic levels of additional data signals received later than the data signals used to determine the phase adjustment to the sampling clock. Since the sampling clock will have a phase adjusted similarly to the jitter that would have been introduced into the additional data signals by SSN, the receivers in I/O 132 may more accurately sample the logic level of the received additional data signals at more appropriate timings. While the phase adjustment was determined using logic levels of data signals received earlier than the additional data signals to be sampled, the phase-adjusted sampling clock still enhances the accuracy of the receivers since the frequency of the supply noise is relative lower than signaling rate of the data signal and the induced jitter from this noise is also low. While both the Vref generation circuit 136 and the sampling clock phase modulation circuit 137 are shown in FIG. 1, in some embodiments just the Vref generation circuit 136 may be used, i.e., that the anti jitter sampling clock modulation by is sampling clock phase modulation circuit 137 "optional." In other embodiments the reverse is true, i.e., just the sampling clock phase modulation circuit 137 may be used with the Vref generation circuit 136 being "optional." And in still further embodiments both can be used.

Figure 2A:
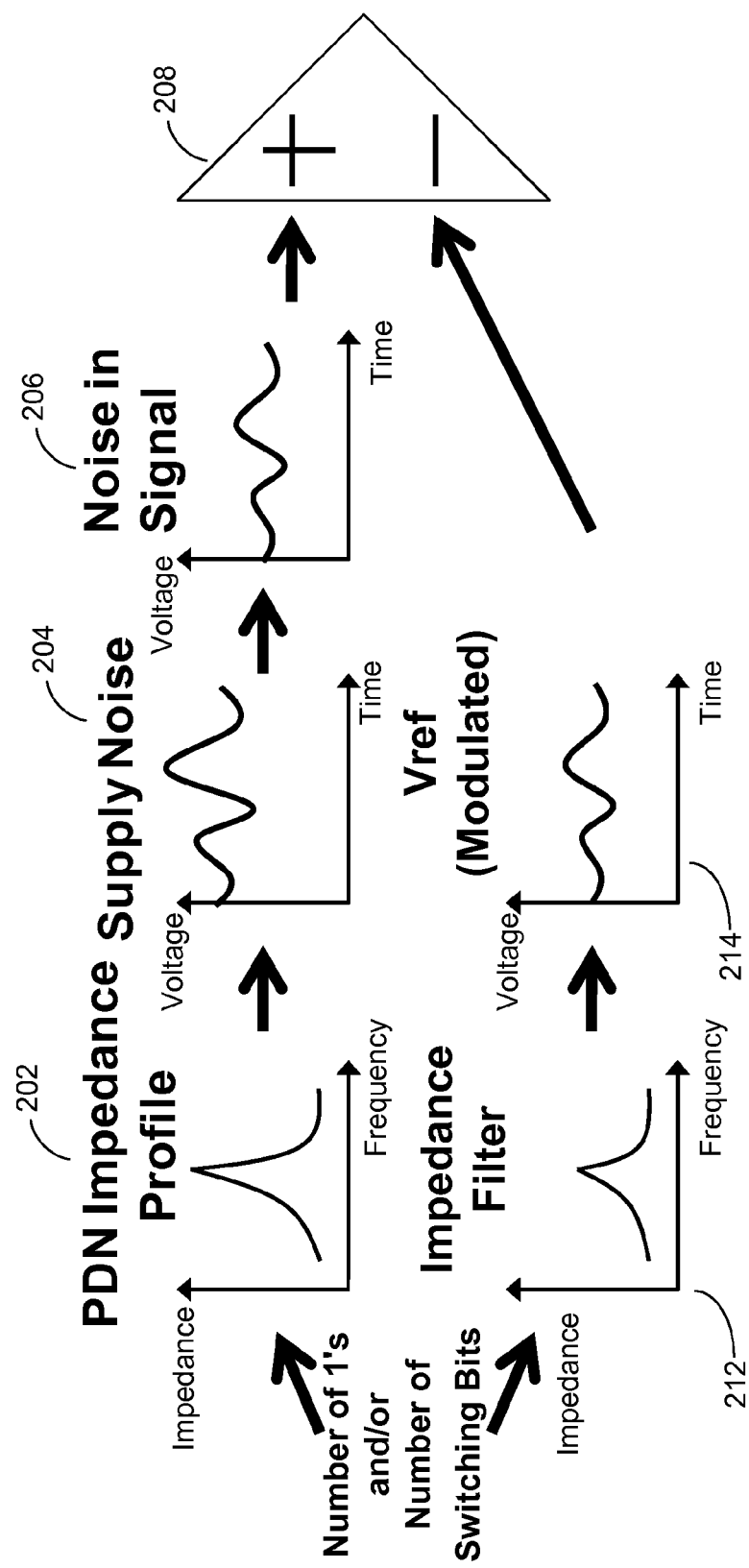
FIG. 2A illustrates adjusting the reference voltage used for sampling data in the receiver of a memory device, according to one embodiment.

FIG. 2A illustrates adjusting the reference voltage used for sampling data in the receiver of a memory device, according to one embodiment. Referring to FIG. 2A, PDN impedance profile 202 is an example of the impedance profile of PDN 122 observed from memory controller 102 or memory device 104. Due to such impedance profile, the transmitted data pattern may generate significant supply noise 204 near the resonance frequency as shown in PDN impedance profile 202. This supply voltage noise 204 is induced into the data signal which in turn becomes noise 206 in the data signal when sampled in a receiver. The amount of supply voltage noise 204 may be dependent on the bus weight and/or the number of switching bits in the data signal. In order to cancel out the noise 206 to be induced in the data signal by the bus weight and/or number of switching bits in the data signal, an impedance filter 212 is employed according to the embodiments herein. Impedance filter 212 has a profile that mimics the shape of the PDN impedance profile 202, and is applied to the bus weight and/or number of switching bits to generate a reference voltage Vref 214 that is modulated by such impedance filter 212 according to the bus weight and/or number of switching bits in the data signal. PDN impedance profile 202 and impedance filter 212 for embodiments that use bus weight for Vref modulation may be different than for embodiments that use the number of switching bits for Vref modulation. The modulated Vref 214 is used as the reference voltage for comparison with the data signals that would also have supply noise induced by simultaneous switching. Since Vref is modulated to have a profile or shape similar to that of the supply noise induced by the PDN 202, comparator 208 will be able to determine the logic level of the received data signal with a proper margin maintained between the received data signal and the reference voltage despite the noise 206 induced into the data signal. In other words, the noise in signal 206 is effectively canceled out because the reference voltage is modulated to mimic the supply noise 204 induced to the data signal. Note that the impedance filter 212 need not have an impedance profile that induces the same "amount" of voltage offset in Vref 214, but it merely induces a voltage offset with the same profile (or shape) as the supply noise 204. Any difference in the actual amount of voltage offset generated by impedance filter 212 may be scaled properly such that the offset included in the modulated Vref 214 is of substantially the same amount as the supply noise 204 added to the data signals.

Figure 2B:
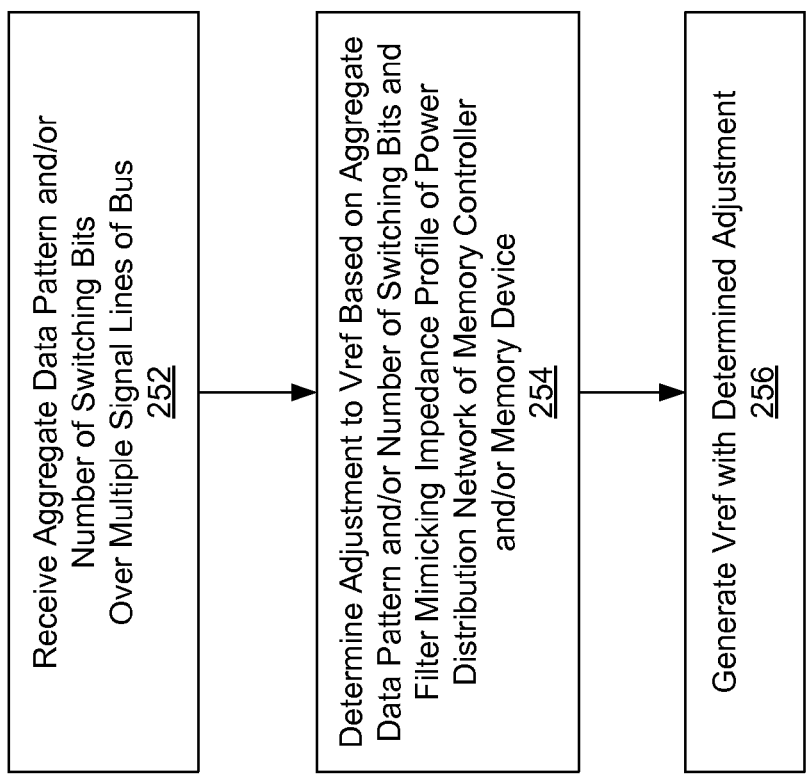
FIG. 2B is a flow chart illustrating adjusting the reference voltage used for sampling data in the receiver of a memory device, according to one embodiment.

FIG. 2B is a flow chart illustrating adjusting the reference voltage used for sampling data in a receiver of a memory device, according to one embodiment. Referring to FIG. 2B, in step 252 an aggregate data pattern (i.e., bus weight) and/or the number of switching bits in a data signal transmitted over multiple signals lines of the bus is received. Then, in step 254, such aggregate data pattern and/or number of switching bits is applied to a filter mimicking the impedance profile of power distribution network(s) in memory controller and/or memory device to determine the adjustment (offset) to be made to the reference voltage Vref used in sampling the data signals. Then, in step 256, the modulated reference voltage Vref is generated with the determined offset added to a nominal reference voltage, which is then used for sampling the received data signals. In some embodiments, steps 254 and 2565 may be iterated by varying coefficients of the filter mimicking the impedance profile of the power distribution network to optimize the adjustment value. In other embodiments, the filter coefficients of the filter can be pre-characterized and stored in a register or BIOS setting.

Figure 3:
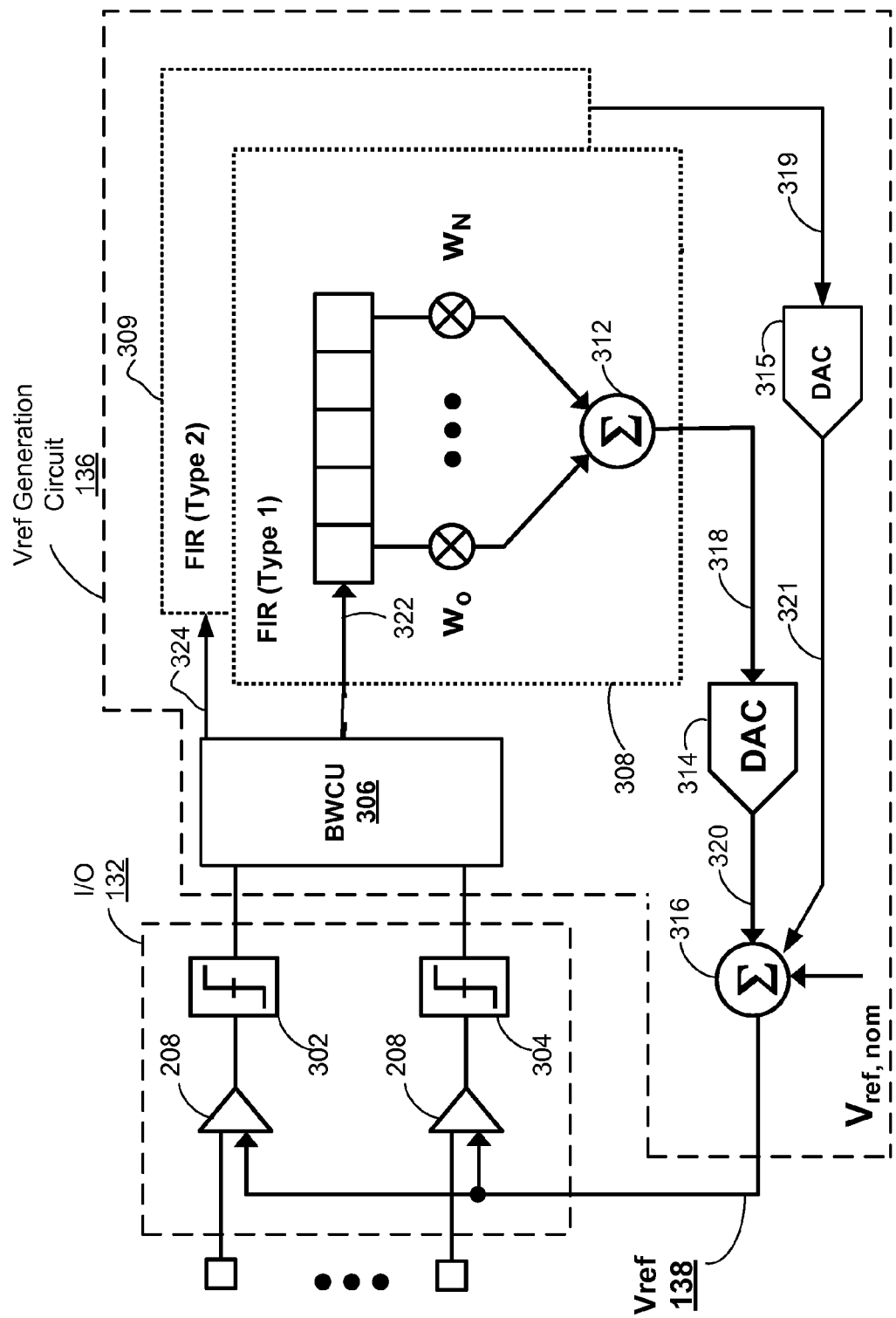
FIG. 3 illustrates a circuit for adjusting the reference voltage in more detail, according to one embodiment.

FIG. 3 illustrates a circuit for adjusting the reference voltage in more detail, according to one embodiment. Referring to FIG. 3, in one embodiment Vref generation circuit 136 includes a bus weight computation unit (BWCU) 306, finite impulse response (FIR) filters 308, 309, digital-to-analog converters (DACs) 314, 315, and adder 316. I/O 132 includes comparators 208 and samplers 302, 304. Comparators 208 compare the received data signals DQ0 through DQn via the bus 120-123 with the modulated reference voltage Vref 138 generated by Vref generation circuit 136. Samplers 302, 304 sample the outputs of comparators 208 at predetermined timings of a sampling clock signal (not shown in FIG. 3). The phase of the sampling clock signal may be adjusted to cancel out jitter, as will be explained below with reference to FIGS. 5A, 5B, 6, and 7. In other embodiments, the adder 316 may be omitted if the filters 308, 309 are configured to output directly the Vref signal 138.

BWCU 306 includes logic circuitry configured to determine the bus weight 322 (i.e., the number of ones, or alternatively the number of zeros), or the number of switching bits 324 in the sampled logic levels of the data signal DQ0 through DQn over the multiple signals lines of the bus 120-123 output by samplers 302, 304, or both. For example, if the data DQ0-DQn is 8-bit data with a pattern of "11011100" then the bus weight (the number of "1s") 322 may be "5" (convertible to binary data). If the data DQ0-DQn changes from"11011100" to "00111100" then the number 324 of switching bits is "3" (convertible to binary data). BWCU may have temporary storage (not shown) for storing the data DQ0-DQn received at one sampling timing until the data DQ0-DQn at the next sampling timing is received to determine the number of switching bits. The determined bus weight 322 and number of switching bits 324 are input to FIR filters 308, 309.

In one embodiment, FIR filter 308 is an N'th order digital filter that has filter characteristics mimicking the impedance profile of PDN 122 and/or PDN 146 in response to the determined bus weight 322. FIR 308 receives the determined bus weight 322 as the input signal, which is weighted by the FIR filter coefficients (or tap weights) $W_0$ through $W_N$ and combined in adder 312 to generate the digital offset 318 for the reference voltage. Such digital offset 318 is converted to an analog offset voltage 320 by DAC 314, which is added to the nominal reference voltage value $V_{ref,\ nom}$ to generate the modulated reference voltage Vref 138. Note that, while an FIR filter 308 is used in the embodiment shown in FIG. 3 to mimic the impedance profile of PDN 122, other types of filters such as an infinite impulse response (IIR) filter may be used to perform similar functions.

In one embodiment, FIR filter 309 is another FIR filter that mimics the impedance profile of PDN 122 (for example, for a predriver (not shown)) in response to the determined number of switching bits 324. FIR 309 receives the determined number of switching bits 324 as the input signal, which is weighted by the FIR filter coefficients (or tap weights) and combined to generate another digital offset 319 for the reference voltage. Such digital offset 319 is converted to an analog offset voltage 321 by DAC 315, which is also added to the nominal reference voltage value $V_{ref,\ nom}$ to generate the modulated reference voltage Vref 138.

The offset voltages 320, 321 are added the nominal reference voltage $V_{ref,\ nom}$ in adder 316 to generate the modulated reference voltage Vref 138. Since the FIRs 308, 309 mimic the impedance profile of PDN 122 in response to the bus weight 322 or the determined number of switching bits 324, respectively, the resulting Vref 138 will be modulated in a manner similar to how the supply noise caused by the PDN network 122 will affect the data signals DQ0 through DQn, as explained above with reference to FIG. 2A. Thus, comparators 208 will be able to compare the noise-affected data signals DQ0 through DQn against similarly modulated Vref 138, such that a proper margin is maintained between the data signals DQ0 through DQn and the reference voltage 138 despite the noise on the data signals caused by the supply noise, which is effectively canceled out. Note that the same modulated Vref may be used with all pins (signal lines) of the data signals DQ0 through DQn, since the supply noise caused by PDN 122 is relatively lower frequency noise that is not sensitive to the pin to pin variations. Also note that the modulated Vref is generated entirely within memory device 104, obviating the need for a separate pin for receiving the modulated Vref from another circuit such as the memory controller 102 in this embodiment of FIG. 3.

Figure 4:
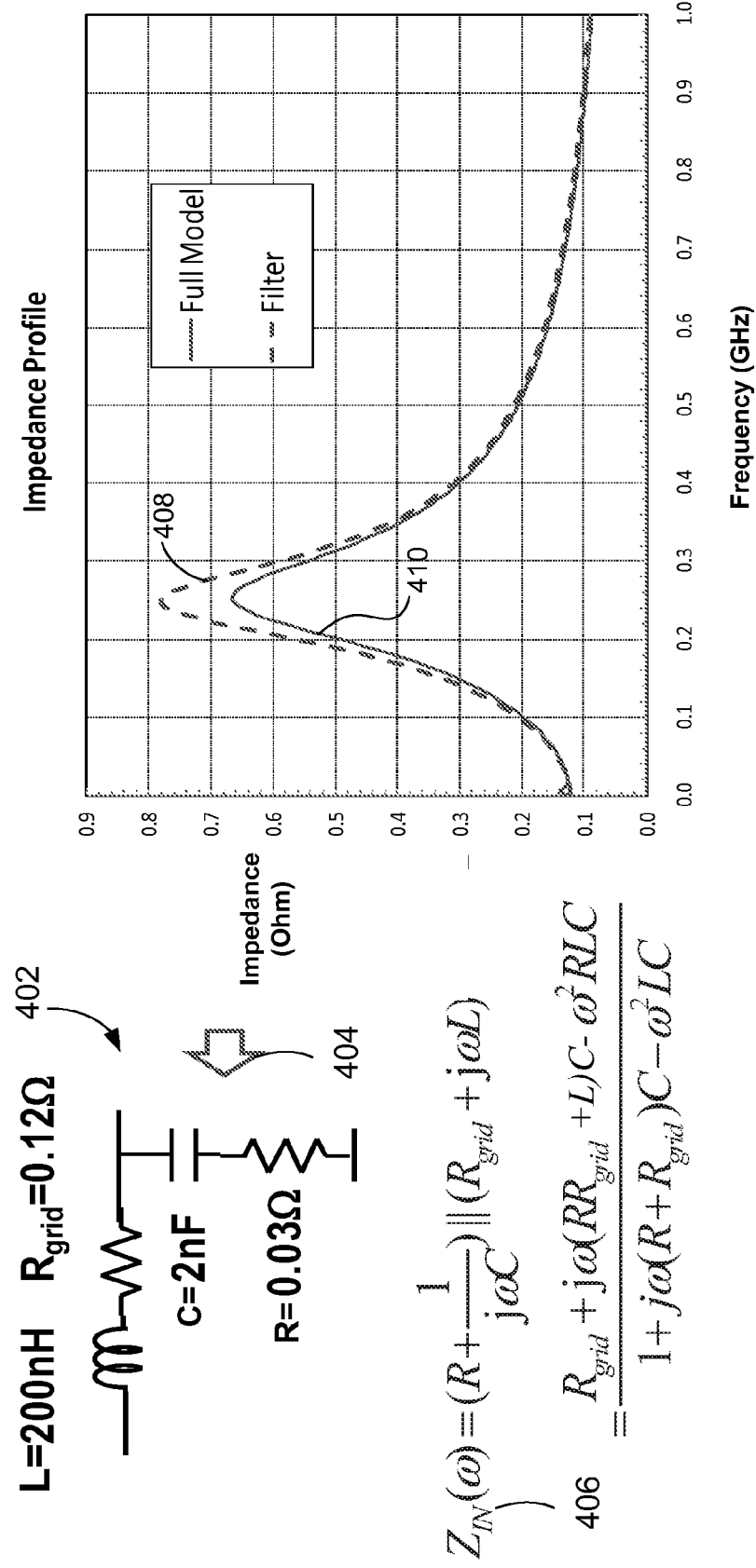
FIG. 4 illustrates how the filter of the circuit for adjusting the reference voltage mimics the impedance profile of the power distribution network, according to one embodiment.

FIG. 4 illustrates how the filter of the circuit for adjusting the reference voltage mimics the impedance profile of the power distribution network, according to one embodiment. Impedance network 402 is one example of what may be the equivalent circuitry of PDN 122 looking from either the transmitter side or the receiver side. The inductance L may represent the IC package inductance of a transmitter or receiver. The capacitance C may represent the on-chip decoupling capacitors of a transmitter or receiver. R and $R_{grid}$ may represent the on-chip distributed resistance of a transmitter or receiver. The equation 406 defines the on-chip side (i.e., where the transmitter or receiver is located) input impedance 404 of impedance network 402, which would have impedance profile 410. As explained above, the FIR filters 308, 309 may be designed such that the impedance profile 408 of the FIR filters 308, 309 mimic the impedance profile 410 of impedance network 402 in response to the bus weight or number of switching bits, respectively. Such design of FIR filters 308, 309 may occur when the memory system 100 (FIG. 1) is being designed, simulated, or characterized in some embodiments. In other embodiments, the coefficients of FIR filters 308, 309 may be determined at initial boot-up of memory system 100 by selecting the proper coefficients to use for FIR filters 308, 309 with known test data patterns transmitted and measuring the bit error rates for various coefficients for the FIR filters 308, 309.

Figure 5A:
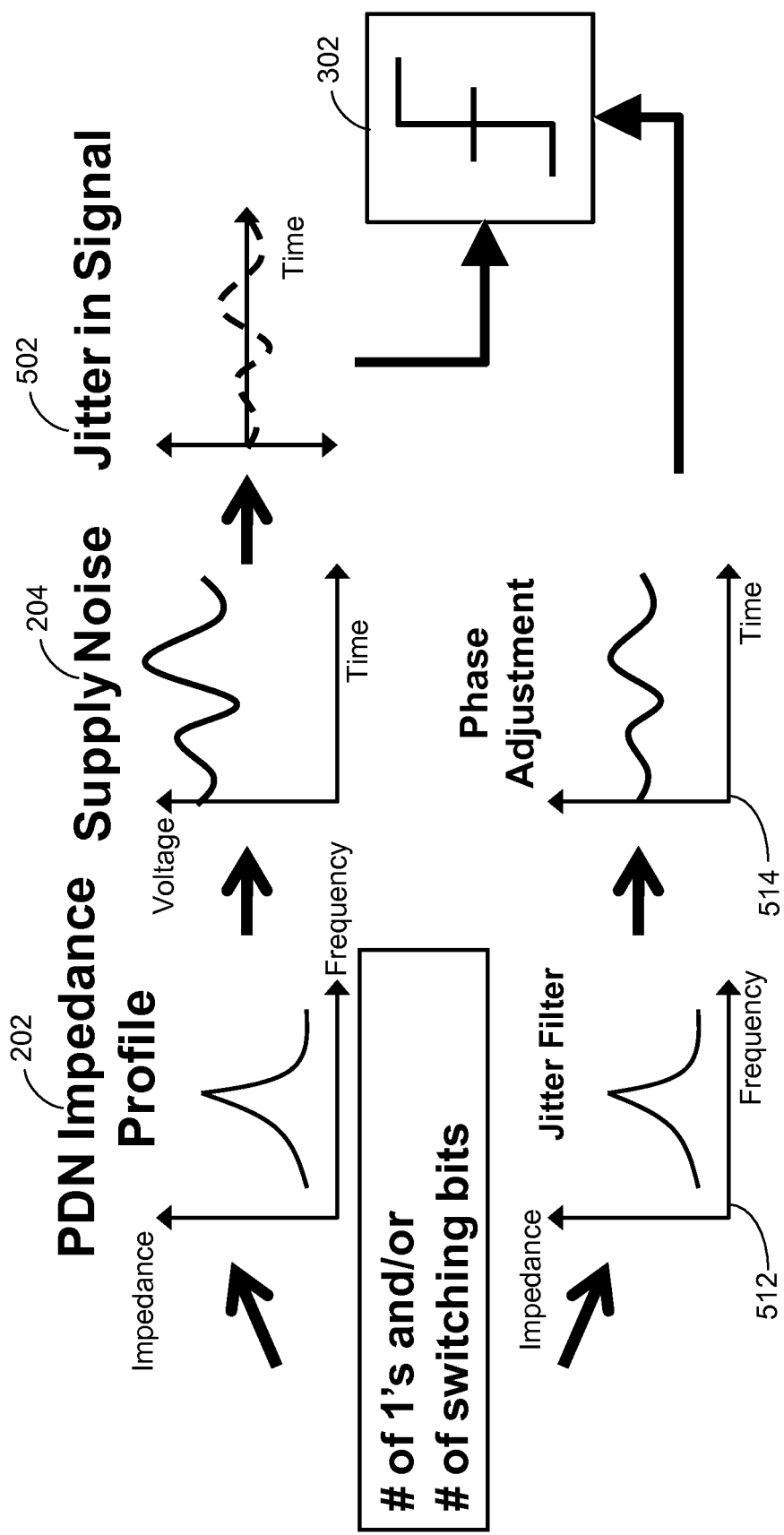
FIG. 5A illustrates adjusting the phase of the clock signal used for sampling data in the receiver of a memory device, according to one embodiment.

FIG. 5A illustrates adjusting the phase of the clock signal used for sampling data in the receiver of a memory device, according to one embodiment. Referring to FIG. 5A, PDN impedance profile 202 is an example of the impedance profile of either memory controller 102 or memory device 104. Due to supply noise 204 associated with such impedance profile, in addition to voltage noise, timing jitter 502 may be induced into the data signal. This timing jitter behavior follows the supply voltage noise 204 pattern multiplied by a jitter sensitivity curve of circuits to the supply noise. The amount of supply voltage noise 204 and jitter 502 is dependent on the bus weight and/or the number of switching bits in the data signal. In order to cancel out the jitter 502 induced in the data signal by SSN as a function of the bus weight and/or number of switching bits in the data signal, a jitter filter 512 is employed according to the embodiments herein. Jitter filter 512 has a jitter profile that mimics the shape of the PDN impedance profile 202 multiplied by the jitter sensitivity curve of circuits. The jitter sensitivity curve is the ratio of jitter amplitude to the injected supply noise in the frequency domain, and is applied to the data signal to generate an amount of phase adjustment 514 to the sampling clock signal that is modulated by such jitter filter 512 according to the bus weight and/or number of switching bits in the data signal. The modulated phase adjustment 514 is applied to the sampling clock phases, which is then used to sample the data signals that would also have jitter induced in a manner correlated with the PDN impedance profile 202. Since the sampling clock phase is modulated similarly to the jitter induced by the supply noise 204 of PDN 202, samplers 302 will be able to sample the logic level of the received data signal at proper timings with jitter effectively canceled out despite the jitter 502 induced into the data signal. In other words, the jitter 502 is effectively canceled out from the data signal because the sampling clock phase is modulated to mimic the jitter induced by the PDN supply noise to the data signal. Alternatively, the sampling clock is controlled so as to effectively cancel out the jitter in the incoming signal.

Figure 5B:
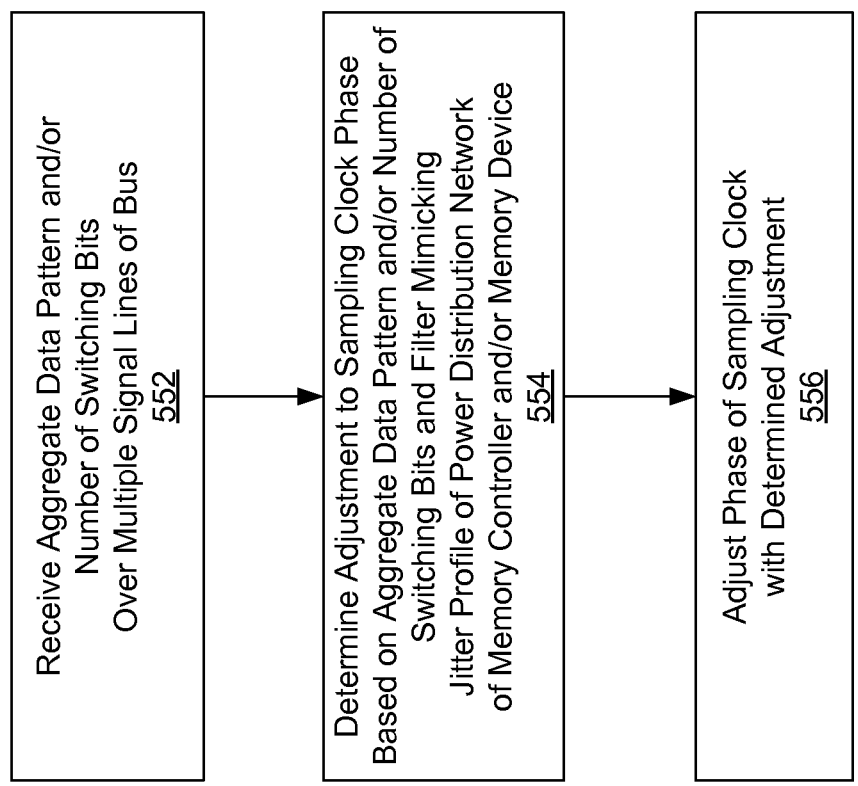
FIG. 5B is a flow chart illustrating adjusting the phase of the clock signal used for sampling data in the receiver of a memory device, according to one embodiment.

FIG. 5B is a flow chart illustrating adjusting the phase of the clock signal used for sampling data in the receiver of a memory device, according to one embodiment. Referring to FIG. 5B, in step 552 an aggregate data pattern (i.e., bus weight) and/or the number of switching bits in a data signal transmitted over multiple signals lines of the bus is received. Then, in step 554, such aggregate data pattern and/or number of switching bits is applied to a filter mimicking the jitter profile of power distribution network(s) in memory controller and/or memory device to determine the adjustment (offset) to be made to the phase of the sampling clock for use in sampling the data signals. Then, in step 556, the sampling clock is generated with the determined phase adjustment, which is then used for sampling the data signals transmitted from the memory controller to the memory device.

Figure 6:
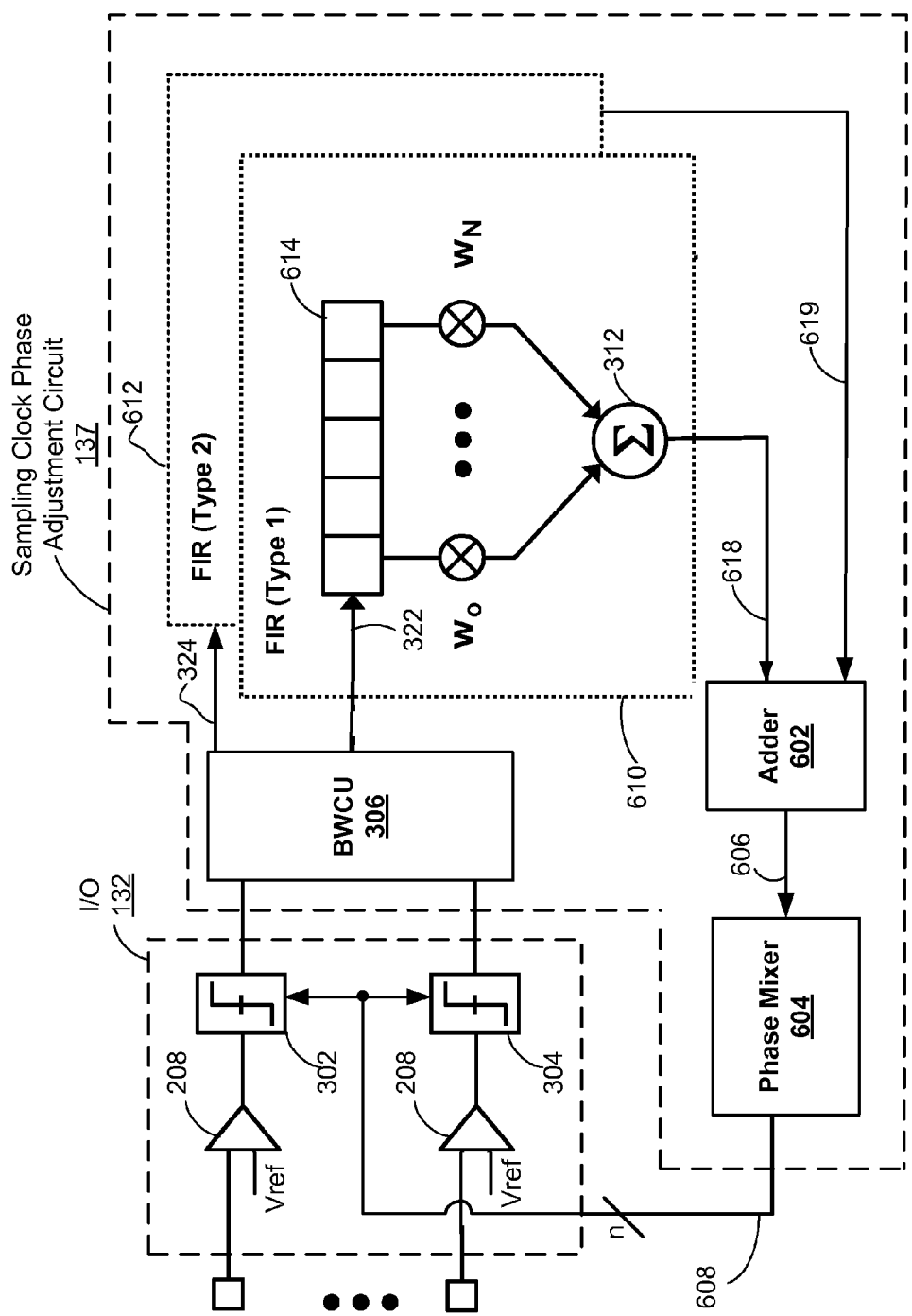
FIG. 6 illustrates a circuit for adjusting the phase of the clock signal in more detail, according to one embodiment.

FIG. 6 illustrates a circuit for adjusting the phase of the clock signal in more detail, according to one embodiment. Referring to FIG. 6, in one embodiment sampling clock phase adjustment circuit 137 includes a bus weight computation unit (BWCU) 306, finite impulse response (FIR) filters 610, 612, adder 602, and phase mixer 604. I/O 132 includes comparators 208 and samplers 302, 304. Comparators 208 compare the received data signals DQ0 through DQn received via the bus 120-123 to determine the logic level of the data signals DQ0 through DQn. Reference voltage Vref 138 may be one that is generated by Vref generation circuit 136 with modulation by a filter according to the bus weight and/or number of switching bits in the data signal to mimic the supply noise induced into the data signals, as described above with reference to FIGS. 2A, 2B, 3 and 4. Samplers 302, 304 sample the outputs of comparators 208 at predetermined timings of a sampling clock signal, the phase of which is adjusted to cancel out jitter by sampling clock phase adjustment circuit 137, as will be explained below.

BWCU 306 includes logic circuitry configured to determine the bus weight 322 (i.e., the number of ones, or alternatively the number of zeros) and the number of switching bits 324 in the sampled logic levels of the data signal DQ0 through DQn over the multiple signals lines of the bus 120-123 output by samplers 302, 304. The determined bus weight 322 and number of switching bits 324 are input to FIR filters 610, 612.

In one embodiment, FIR filter 610 is an N'th order digital filter that has filter characteristics that mimic the jitter profile of the transmitter in response to the determined bus weight 322. Such jitter profile of PDN 122 and/or PDN 146 may be equivalent to the impedance profile of the transmitter multiplied by the jitter sensitivity curve of transmitter to the supply noise. FIR 610 receives the determined bus weight 322 as the input signal, which is weighted by the FIR filter coefficients (or tap weights) $W_o$ through $W_N$ and combined in adder 312 to generate the digital phase adjustment value 618 for the sampling clock, which is input to adder 602. Note that, while an FIR filter 610 is used in the embodiment shown in FIG. 6 to mimic the jitter profile of PDN 122, other types of filters such as infinite impulse response (IIR) filters may be used to perform similar functions.

In one embodiment, FIR filter 612 is another FIR filter that mimics the jitter profile of PDN 122 in response to the determined number of switching bits 324. In this case, BWCU contains the storage elements to detect switching bits. FIR filter 612 receives the determined number of switching bits 324 as the input signal, which is weighted by the FIR filter coefficients (or tap weights) and combined to generate another digital phase adjustment value 619 for the sampling clock, which is also input to adder 602.

Adder 602 combines the digital phase adjustment values 618, 619 to generate a combined phase adjustment value 606, which is input to phase mixer 604. Phase mixer 604 adjusts the nominal phase of the sampling clock signal based on the phase adjustment value 606, and generates phase-adjusted sampling clocks 608 for each of the samplers 302, 304 for the n-bit data signals DQ0 through DQn. The operation of phase mixer 604 is explained in more detail below with reference to FIG. 7. Since the FIRs 610, 612 mimic the jitter profile of PDN 122 in response to the bus weight 322 or the determined number of switching bits 324, respectively, the phase of the sampling clock signal(s) will be modulated in a manner similar to how the supply noise caused by PDN 122 will cause jitter in data signal DQ0 through DQn, as explained above in FIG. 5. Thus, samplers 302, 304 will be able to sample the jitter-affected data signals DQ0 through DQn at proper timings with the phase of the sampling clock similarly affected by such supply noise, effectively removing the jitter caused in the data signal DQ0 through DQn.

Such configuration of FIR filters 610, 612 may occur when the memory system 100 (FIG. 1) is being designed, simulated, or characterized in some embodiments. In other embodiments, the coefficients of FIR filters 610, 612 may be determined at initial boot-up of memory system 100 by selecting the proper coefficients to use for FIR filters 610, 612 with known test data patterns transmitted and measuring the bit error rates for various coefficients for the FIR filters 610, 612.

While FIR filters 610, 612 in FIG. 6 are designed to mimic the jitter profile of PDN 122 in this embodiment, it is also possible for the FIR filters 610, 612 to be serially coupled to the FIR filters 308, 309, respectively, that mimic the impedance profile of PDN 122. In such embodiments, FIR filters 610, 612 would mimic just the jitter sensitivity curve of PDN 122 rather than the entire jitter profile of PDN 122, since the earlier serially coupled FIR filters 308, 309 mimic the impedance profile of PDN 122, and together with the FIR filters 610, 612 the entire jitter profile would be mimicked.

Figure 7:
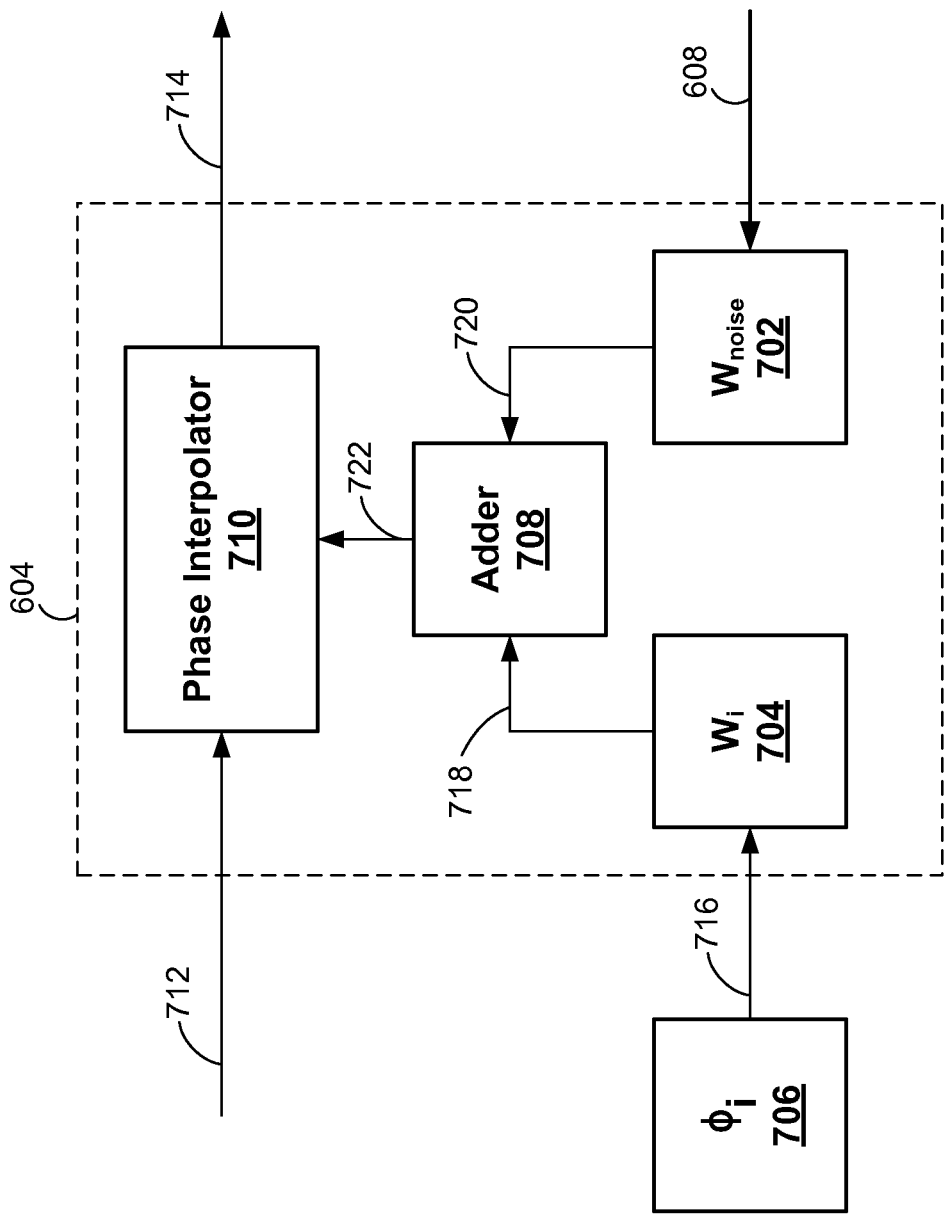
FIG. 7 illustrates the phase mixer of FIG. 6 in more detail, according to one embodiment.

FIG. 7 illustrates the phase mixer of FIG. 6 in more detail, according to one embodiment. Phase mixer 604 includes weighting units 702, 704, an adder 708, and a phase interpolator 710. Weighting unit 702 receives the phase adjustment value 608 (FIG. 6), which is weighted by weighting factor $W_{noise}$. In one embodiment, the same weighting factor $W_{noise}$ and the same phase adjustment value 608 may be used for the sampling clock for all signal lines of the bus, since the jitter caused by the supply noise of the transmitter and receiver is relatively low frequency noise that would affect all signal lines in a similar manner.

Weighting unit 704 receives a nominal phase value $\phi_i$ 706, which is weighted by weighting factor $W_i$. In one embodiment, sampling clock nominal phase value 706 is different for each signal line of the bus, and may be set differently for each signal line according to various calibration techniques that account for variations in sampling clock phase caused by variations in temperature, voltage, etc. The example in FIG. 7 illustrates how the sampling clock phase for one signal line of the bus is adjusted, based on the nominal phase value $\phi_i$ 706 for signal line i corresponding to data $DQ_i$. However, in other embodiments, the same nominal phase value 706 may be used with all signal lines of the bus.

The weighted nominal phase value 718 and the weighted phase adjustment value 720 are added in adder 708 to generate a combined phase adjustment value 722. In one embodiment, combined phase adjustment value 722 is a digital phase code that is input to phase interpolator 710. Phase interpolator 710 receives the sampling clock signal 712 for one (i) of the signal lines and adjusts the phase of the sampling clock according to the digital phase code 722 to generate the phase adjusted sampling clock signal 714 for signal line i, which is used in the sampler corresponding to data $DQ_i$. In one embodiment, sampling clock signal 712 may include two signals representing a quadrature clock used by phase interpolator 710. The phase of the sampling clock for other signal lines of the bus may be generated in a similar manner using a different nominal phase value 706 for that signal line but with the same phase adjustment value 608 for all signal lines.

The weighting factors $W_i$ and $W_{noise}$ may be calibrated to account for different operating conditions. For example, in order to calibrate weighting factor $W_i$, calibration factor $W_{noise}$ may be set to zero, and a known data pattern may be transmitted, received and sampled using phase adjusted sampling clock 714 while sweeping weighting factor $W_i$ through a range of values. The optimum weighting factor $W_i$ to use is selected based on the weighting factor $W_i$ that allows the bit error rate of the received data signal to be at its minimum. Weighting factor $W_{noise}$ may be calibrated in a similar manner with weighting factor $W_i$ set to zero and measuring the bit error rate of the received data signal in response to transmission of a known data pattern while sweeping weighting factor $W_{noise}$ through a range of values.

Figure 8:
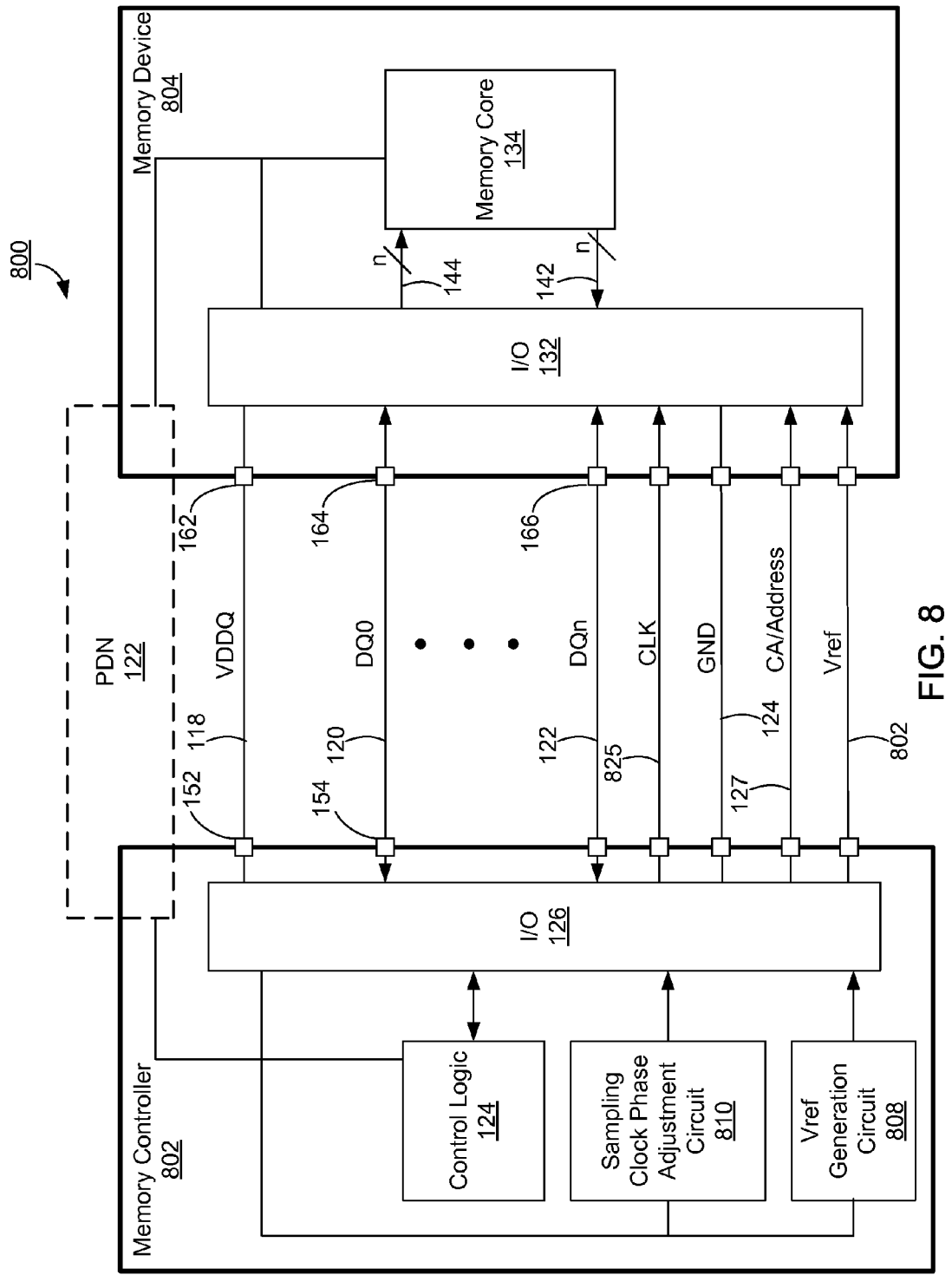
FIG. 8 illustrates a memory system that adjusts the reference voltage and/or the sampling clock phase used for sampling data, according to another embodiment.

FIG. 8 illustrates a memory system that adjusts the reference voltage and/or the sampling clock phase used for sampling data in the receiver of a memory device, according to another embodiment. The embodiment of FIG. 8 is similar to the embodiment shown in FIG. 1, except that the Vref generation circuit 808 and the sampling clock phase adjustment circuit 810 are present in memory controller 802 rather than in memory device 804. Vref generation circuit 808 and sampling clock phase adjustment circuit 810 operate in a manner similar to Vref generation circuit 136 and sampling clock phase adjustment circuit 137, respectively, in the embodiment of FIG. 1, except that they are on the memory controller side and thus use the bus weight and/or number of switching bits in the data to be sent to memory device rather than those of the data that was received earlier as with the embodiment of FIG. 1. The adjusted Vref and phase-adjusted sampling clock CLK are generated on the memory controller 802 and forwarded to memory device 804 over lines 802, 825, respectively, for use in sampling the data DQ0 through DQn.

Figure 9B:
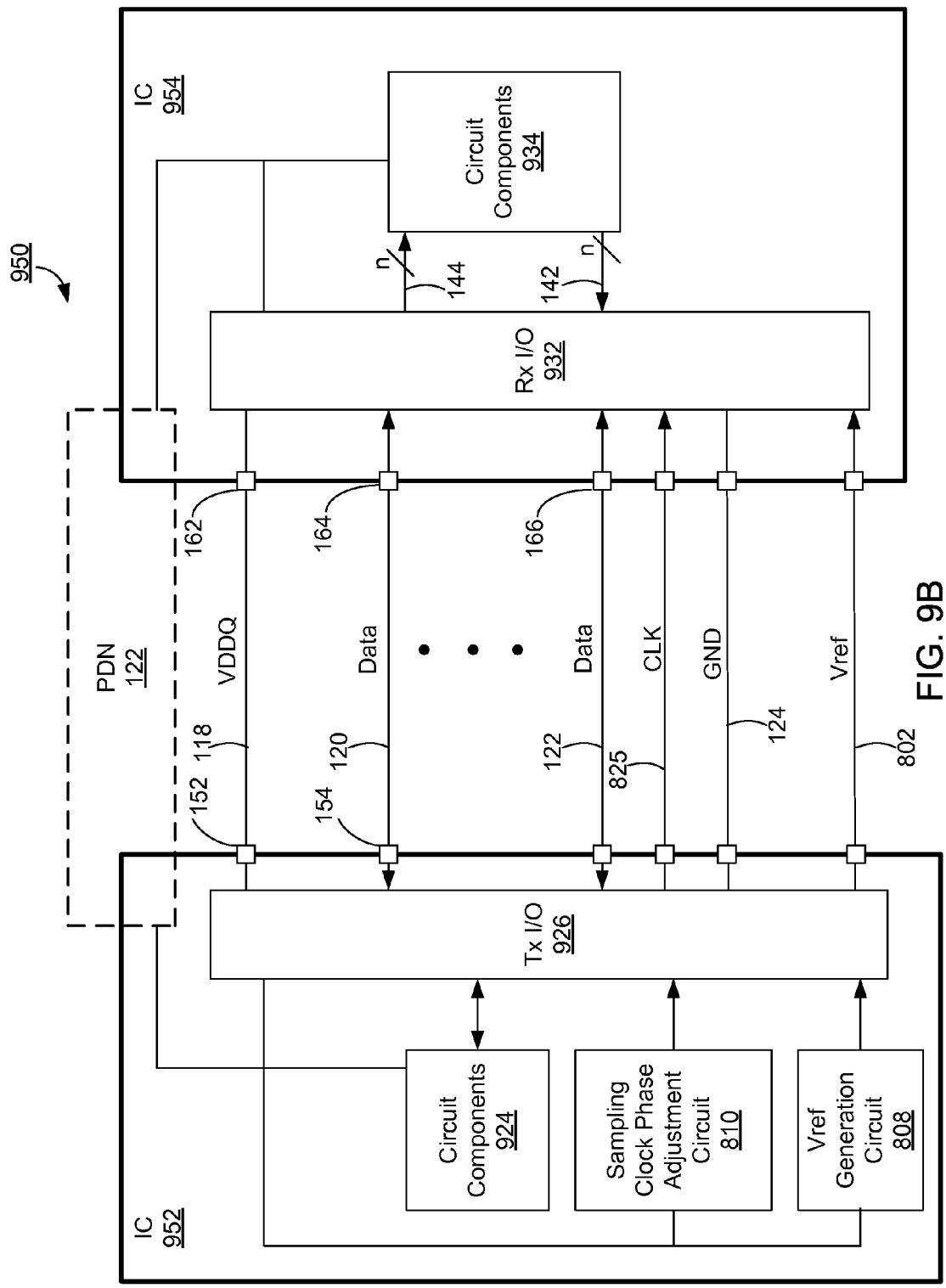

FIGS. 9A and 9B illustrate systems that adjust the reference voltage and/or the sampling clock phase used for sampling data transmitted between integrated circuits, according to still other embodiments. The embodiment of FIG. 9A illustrates a system that communicates data signals 120, 123 between integrated circuits (ICs) 902, 904, which may be any type of ASIC or other types of integrated circuits. More specifically, FIG. 9A illustrates an embodiment that includes Vref generation circuit 136 and sampling phase adjustment circuit 137 on the receiver side IC 904 together with a receiver I/O (Rx I/O) 932 and other circuit components 934, while the transmitter side IC 902 includes other circuit components 924 as well as a transmitter I/O (Tx I/O) 926. Vref generation circuit 136 and sampling clock phase adjustment circuit 137 operate in a manner similar to Vref generation circuit 136 and sampling clock phase adjustment circuit 137, respectively, in the embodiment of FIG. 1.

The embodiment of FIG. 9B also illustrates a system that communicates data signals 120, 122 between integrated circuits (ICs) 952, 954, which may be any type of ASIC or other types of integrated circuits. Vref generation circuit 810 and sampling phase adjustment circuit 808 are included on the transmitter side IC 952 together with a transmitter I/O (Tx I/O) 926 and other circuit components 924, while the receiver side IC 954 includes other circuit components 934 as well as a receiver I/O (Rx I/O) 932. Vref generation circuit 810 and sampling clock phase adjustment circuit 808 operate in a manner similar to Vref generation circuit 810 and sampling clock phase adjustment circuit 808, respectively, in the embodiment of FIG. 8.

Upon reading this disclosure, those of ordinary skill in the art will appreciate still alternative structural and functional designs for effectively removing noise and jitter caused by supply noise in the power distribution networks in a memory controller and/or a memory device through the disclosed principles of the present disclosure. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure herein without departing from the spirit and scope of the disclosure as defined in the appended claims.

What is claimed is:

1. A method for reducing simultaneous switching noise in data transmitted from a first circuit to a second circuit over a bus including a plurality of signal lines, the method comprising:
   determining at least one of a bus weight and a number of switching bits in a data pattern received via the plurality of signal lines of the bus at a first timing; and
   adjusting a reference voltage to be used in sampling a data signal at the second circuit based on an impedance profile of a power distribution network in at least one of the first circuit and the second circuit and at least one of the determined bus weight and the number of switching bits.

2. The method of claim 1, wherein adjusting the reference voltage comprises:
   determining an adjustment voltage for the reference voltage by applying a filter to at least one of the determined bus weight and the number of switching bits, the filter having an impedance profile mimicking the impedance profile of the power distribution network in at least one of the first circuit and the second circuit, and the adjustment voltage mimicking supply noise added to the data signal by the power distribution network in at least one of the first circuit and the second circuit.

3. The method of claim 2, further comprising adding the adjustment voltage to a nominal reference voltage to generate the reference voltage to be used in sampling the data signal.

4. The method of claim 1, wherein the reference voltage is adjusted in the second circuit without the reference voltage being forwarded from the first circuit to the second circuit.

5. The method of claim 1, wherein the data signal is sampled at a second timing using the adjusted reference voltage, the second timing being subsequent to the first timing at which the bus weight or the number of switching bits in the data pattern is determined.

6. The method of claim 1, further comprising adjusting a phase of a clock signal to be used in sampling the data signal based on at least one of the determined bus weight and the number of switching bits, the data signal being sampled at predetermined timings of the clock signal with the adjusted phase.

7. The method of claim 6, wherein adjusting the phase of the clock signal comprises:
   determining a phase adjustment by applying a filter to the determined bus weight or the number of switching bits, the filter having a jitter profile mimicking a jitter profile of a power distribution network in at least one of the first circuit and the second circuit, and the phase adjustment mimicking jitter added to the data signal by the power distribution network in at least one of the first circuit and the second circuit.

8. The method of claim 7, further comprising combining the determined phase adjustment with a nominal phase of the clock signal to adjust the phase of the clock signal to be used in sampling the data signal.

9. The method of claim 1, wherein the bus weight is correlated with the number of ones in the data pattern.

10. The method of claim 1, wherein the reference voltage is generated and adjusted in the first circuit and forwarded to the second circuit.

11. A method for reducing simultaneous switching noise in data transmitted from a first circuit to a second circuit over a bus including a plurality of signal lines, the method comprising:
   determining at least one of a bus weight and a number of switching bits in a data pattern received via the plurality of signal lines of the bus at a first timing; and
   adjusting a phase of a clock signal to be used in sampling a data signal based on a jitter profile of a power distribution network in at least one of the first circuit and the second circuit and at least one of the determined bus weight and the number of switching bits, the data signal being sampled at predetermined timings of the clock signal with the adjusted phase.

12. The method of claim 11, wherein adjusting the phase of the clock signal comprises:
   determining a phase adjustment by applying a filter to the determined bus weight or the number of switching bits, the filter having a jitter profile mimicking the jitter profile of the power distribution network in at least one of the first circuit and the second circuit, and the phase adjustment mimicking jitter added to the data signal by the power distribution network in at least one of the first circuit and the second circuit.

13. The method of claim 12, further comprising combining the determined phase adjustment with a nominal phase of the clock signal to adjust the phase of the clock signal to be used in sampling the data signal.

14. A first circuit receiving data transmitted from a second circuit over a bus including a plurality of signal lines, the first circuit comprising:
   logic circuitry operable to determine at least one of a bus weight and a number of switching bits in a data pattern received via the plurality of signal lines of the bus at a first timing; and
   reference voltage generation circuitry operable to adjust a reference voltage to be used in sampling a data signal at the first circuit based on an impedance profile of a power distribution network in at least one of the first circuit and the second circuit and at least one of the determined bus weight and the number of switching bits.

15. The first circuit of claim 14, wherein the reference voltage generation circuit includes a filter having an impedance profile mimicking the impedance profile of the power distribution network in at least one of the first circuit and the second circuit, an adjustment voltage for the reference voltage being determined by applying the filter to at least one of the determined bus weight and the number of switching bits, and the adjustment voltage mimicking supply noise added to the data signal by the power distribution network in at least one of the first circuit and the second circuit.

16. The first circuit of claim 15, wherein the reference voltage generation circuit adds the adjustment voltage to a nominal reference voltage to generate the reference voltage to be used in sampling the data signal.

17. The first circuit of claim 14, further comprising a sampler sampling the data signal at a second timing using the adjusted reference voltage, the second timing being subsequent to the first timing at which the bus weight or the number of switching bits in the data pattern is determined.

18. The first circuit of claim 14, further comprising a phase mixer adjusting a phase of a clock signal to be used in sampling the data signal based on at least one of the determined bus weight and the number of switching bits, the data signal being sampled at predetermined timings of the clock signal with the adjusted phase.

19. The first circuit of claim 18, further comprising a filter having a jitter profile mimicking a jitter profile of a power distribution network in at least one of the first circuit and the second circuit, the at least one of the determined bus weight and the number of switching bits being applied to the filter to determine a phase adjustment value, the phase adjustment value mimicking jitter added to the data signal by the power distribution network in at least one of the first circuit and the second circuit.

20. The first circuit of claim 19, further comprising a phase mixer to combine the determined phase adjustment value with a nominal phase of the clock signal to adjust the phase of the clock signal to be used in sampling the data signal.

21. The first circuit of claim 14, wherein the bus weight is correlated with the number of ones in the data pattern.

22. A first circuit receiving data transmitted from a second circuit to the first circuit to the second circuit over a bus including a plurality of signal lines, the first circuit comprising:
 logic circuitry to determine at least one of a bus weight and a number of switching bits in a data pattern received via the plurality of signal lines of the bus at a first timing; and
 clock phase adjustment circuit to adjust a phase of a clock signal to be used in sampling a data signal based on a jitter profile of a power distribution network in at least one of the first circuit and the second circuit and at least one of the determined bus weight and the number of switching bits, the data signal being sampled at predetermined timings of the clock signal with the adjusted phase.

23. The first circuit of claim 22, further comprising a filter having a jitter profile mimicking the jitter profile of the power distribution network in at least one of the first circuit and the second circuit, the at least one of the determined bus weight or the number of switching bits being applied to the filter to determine a phase adjustment value, the phase adjustment value mimicking jitter added to the data signal by the power distribution network in at least one of the first circuit and the second circuit.

24. The first circuit of claim 23, further comprising a phase mixer to combine the determined phase adjustment value with a nominal phase of the clock signal to adjust the phase of the clock signal to be used in sampling the data signal.

* * * * *